(12) United States Patent
Ziolek et al.

(10) Patent No.: US 8,131,513 B2
(45) Date of Patent: Mar. 6, 2012

(54) METHOD AND SYSTEM OF COMPUTER ASSISTED VEHICLE SEAT DESIGN

(75) Inventors: Scott Ziolek, Ann Arbor, MI (US);
Terry O'Bannon, Royal Oak, MI (US);
Ash Galbreath, Troy, MI (US); Asad S. Ali, Troy, MI (US)

(73) Assignee: Lear Corporation, Southfield, MI (US)

( * ) Notice: Subject to any disclaimer, the term of this patent is extended or adjusted under 35 U.S.C. 154(b) by 910 days.

(21) Appl. No.: 11/486,777

(22) Filed: Jul. 14, 2006

(65) Prior Publication Data

US 2008/0015822 A1     Jan. 17, 2008

(51) Int. Cl.
*G06F 17/50* (2006.01)
*A47C 7/02* (2006.01)

(52) U.S. Cl. .......................................... 703/1; 297/452.1

(58) Field of Classification Search .................. 703/1, 8; 280/735; 297/452.1
See application file for complete search history.

(56) References Cited

U.S. PATENT DOCUMENTS

| | | | |
|---|---|---|---|
| 4,131,918 A * | 12/1978 | Pettit et al. ........................ 360/1 |
| 4,701,132 A | 10/1987 | Groesch et al. | |
| 4,781,417 A | 11/1988 | Shipman et al. | |
| 5,193,285 A * | 3/1993 | Heinrich et al. ............. 33/514.2 |
| 5,379,646 A | 1/1995 | Andrzejak et al. | |
| 5,456,019 A * | 10/1995 | Dowell et al. .................... 33/600 |
| 5,490,718 A | 2/1996 | Akizuki et al. | |
| 5,648,915 A | 7/1997 | McKinney et al. | |
| 5,656,106 A * | 8/1997 | Amateau et al. .............. 148/586 |
| 5,991,528 A * | 11/1999 | Taylor et al. ....................... 703/6 |
| 6,024,378 A * | 2/2000 | Fu ..................... 280/735 |
| 6,090,148 A * | 7/2000 | Weber et al. ....................... 703/8 |
| 6,096,086 A * | 8/2000 | Weber et al. ....................... 703/8 |
| 6,096,087 A | 8/2000 | Weber et al. | |
| 6,110,216 A | 8/2000 | Weber et al. | |
| 6,113,643 A | 9/2000 | Weber et al. | |
| 6,113,644 A | 9/2000 | Weber et al. | |
| 6,131,436 A | 10/2000 | O'Bannon et al. | |
| 6,144,890 A * | 11/2000 | Rothkop ......................... 700/97 |
| 6,220,089 B1 | 4/2001 | Gu et al. | |
| 6,367,397 B1 * | 4/2002 | Musco et al. ............ 112/475.05 |
| 6,749,433 B2 | 6/2004 | Kassai et al. | |
| 6,755,141 B2 * | 6/2004 | Musco et al. ............ 112/475.05 |
| 6,760,693 B1 | 7/2004 | Singh et al. | |

(Continued)

FOREIGN PATENT DOCUMENTS

GB     2333383 A     7/1999

(Continued)

OTHER PUBLICATIONS

Ekern et al, "Kinetic Computer Modeling of Human Posture in Automotive Seats", 1997, Society of Automotive Engineers, Inc. pp. 125-133.*

(Continued)

*Primary Examiner* — Kamini S Shah
*Assistant Examiner* — Hung Havan
(74) *Attorney, Agent, or Firm* — Brooks Kushman P.C.

(57) ABSTRACT

Method of computer-assisted assessment of seat design. The method being applicable to any type of seating, including but not limited to vehicle seating commonly employed in automobiles, watercraft, aircraft, etc. The method may include overlaying a shaped data object relative to an architectural drawing to facilitate assessing component comportment with desired structural boundaries.

15 Claims, 3 Drawing Sheets

U.S. PATENT DOCUMENTS

| | | | |
|---|---|---|---|
| 6,824,212 B2 | 11/2004 | Malsch et al. | |
| 6,840,125 B1* | 1/2005 | Reynolds et al. | 73/866.4 |
| 6,982,409 B2 | 1/2006 | Huang et al. | |
| 7,047,831 B2* | 5/2006 | Reynolds et al. | 73/866.4 |
| 7,152,920 B2 | 12/2006 | Sugiyama et al. | |
| 7,378,978 B2 | 5/2008 | Cassaday | |
| 2004/0011150 A1 | 1/2004 | Reynolds et al. | |
| 2004/0236455 A1 | 11/2004 | Woltman et al. | |
| 2004/0236552 A1 | 11/2004 | Pieper et al. | |
| 2005/0033559 A1 | 2/2005 | Wander | |
| 2005/0081656 A1 | 4/2005 | Saari et al. | |
| 2005/0160842 A1 | 7/2005 | Reynolds et al. | |
| 2005/0212797 A1* | 9/2005 | Lee et al. | 345/419 |
| 2005/0242650 A1* | 11/2005 | Reynolds et al. | 297/452.5 |
| 2007/0152483 A1 | 7/2007 | Fujita et al. | |
| 2007/0236071 A1* | 10/2007 | Fujita et al. | 297/452.5 |

FOREIGN PATENT DOCUMENTS

| | | |
|---|---|---|
| GB | 2362551 A | 11/2001 |
| JP | 7143922 A | 6/1995 |
| JP | 200314667 A | 1/2003 |

OTHER PUBLICATIONS

Reed et al, "Survey of Auto Seat Design Recommendations for Improved Comfort", 1994, University of Michigan Transportation Research Institute, pp. 1-96.*

Rusak et al, "Physically-based operators for virtually clay modeling in a collaborative virtual design environment", Apr. 2002, Proceedings of the TMCE 2002. pp. 299-314.*

Great Britain Search and Examination Report for Application No. GB0713496.8, mailed Oct. 31, 2007, 7pages.

* cited by examiner

METHOD AND SYSTEM OF COMPUTER ASSISTED VEHICLE SEAT DESIGN

BACKGROUND OF THE INVENTION

1. Field of the Invention

The present invention relates to methods and systems associated with vehicle seat design.

2. Background Art

Vehicle seats may include any number of components, such as but not limited to a seat back and seat bottom. The components may include any number of elements, such as but not limited to a frame, cushioning, suspension, etc. The size, shape, feel, orientation, etc., of these and other features of the seat may influence comfort, performance, and other seat amenities.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
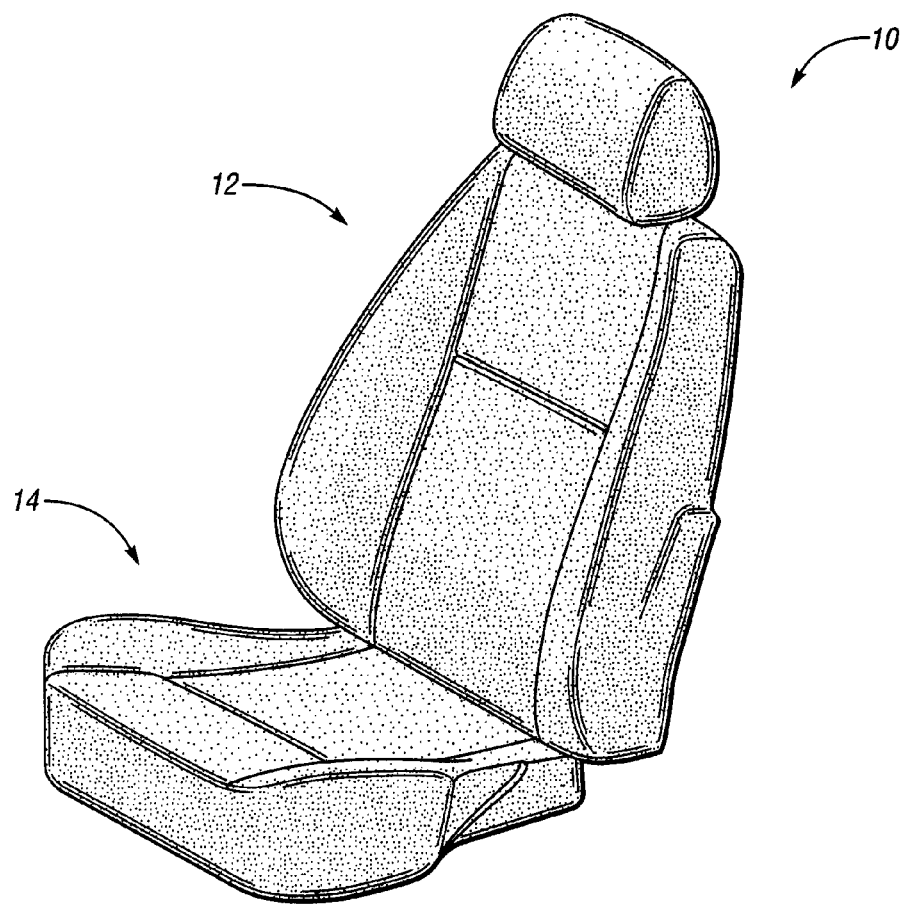
FIG. 1 illustrates a vehicle seat in accordance with one non-limiting aspect of the present invention.

FIG. 1 illustrates a vehicle seat 10 in accordance with one non-limiting aspect of the present invention. The vehicle seat 10 may include any number of features and elements associated with supporting an occupant. The vehicle seat 10 may be suitable for use in any number of environments, including but not limited to automobiles, watercraft, aircraft, etc.

The vehicle seat 10 may include any number of components, such as but not limited to a seat back 12 and a seat bottom 14. The seat back and bottom may include any number of elements for supporting the occupant and/or other features associated with the seat 10, such as but not limited to a frame, suspension, foam support, lumbar, etc. These and other elements may cooperate to comprise each component 12-14.

As one having ordinary skill in the art will appreciate, the shape and contour of the seat 10 may be designed to provide passenger comfort and control. It has been known in the automotive industry to rely on a tool built in the early 1960's to represent a position of hip joints for locating a position of a vehicle occupant in an vehicle, commonly referred to as a h-point (hpt). This tool is commonly known as "Oscar." It was not originally intended for seat design but has become an industry standard to facilitate locating an occupant's torso within the seat.

The shape, weight, and dimensioning defined by Oscar is commonly used when designing seat shapes and supports. The shape and dimension of Oscar, however, is based on 1960's information and data, making it less than ideal for designing vehicle seats to accommodate passengers of today.

Figure 2:
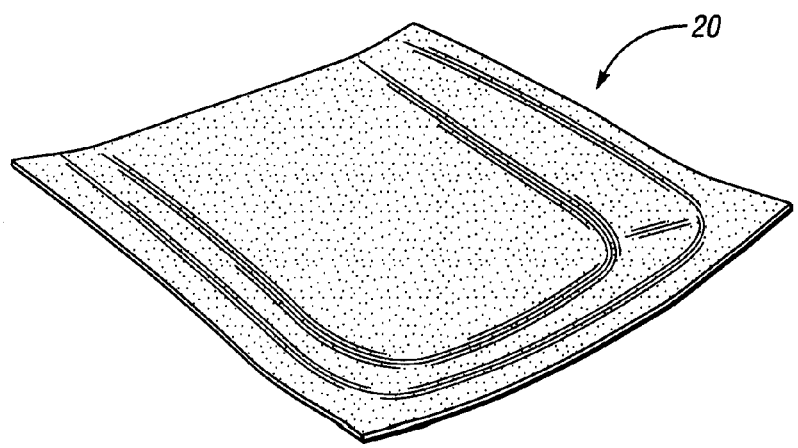
FIG. 2 illustrates a pan shape in accordance with one non-limiting aspect of the present invention.

FIG. 2 illustrates a pan shape 20 in accordance with one non-limiting aspect of the present invention. The pan shape 20 may be used in place of the Oscar model when designing seat bottoms to accommodate passengers of today. The pan shape 20 is generally larger and includes curvatures designed to provide differential pressures across the occupants legs when compared to the Oscar model.

This, for example, may include making the pan shape 20 wider and longer than Oscar and with curvatures designed to provide more pressure/support at areas of focused/greater weight, i.e. differentiating its curvature to provide differential pressure relative to where a person's skeletal structure and soft tissue structure interacts with the seat pan.

The pan shape 20 may be embodied in a computer-readable medium or other electronic representation and converted to a data object suitable for use within a computer aided design (CAD) application. The data object may be used to represent the pan shape 20 as a three-dimensional data object that can be imported into a computer design application to facilitate designing seat bottoms, as one having ordinary skill in the art will appreciate.

In this manner, the present invention is able to graphically depict a desired shape for supporting a body relative to an idealized seat pan arrangement. The data object can be stored electronically and made accessible to CAD designs when designing seat bottoms. Such information may be useful in graphically illustrating size and shapes for different locations of the seat bottom 14 and the structural members associated therewith.

The pan shape 20 may be derived from the Oscar dimensional requirements. For example, the Oscar specified dimensions for length of the cushion pan assembly, radius of transverse and longitudinal sections, width of the cushion pan assembly through the hpt, and width of the cushion pan assembly 250mm forward of the hpt may be used as a starting point and adjusted to accommodate the soft tissue and skeletal dimension associated with more recent body patterns, such as those commonly available from a variety of anthropometric sources.

In more detail, the Oscar specified dimensions may be corrected according to desired pressure points defined relative to an occupant more reflective of today's occupants, as opposed to the 1960's occupant defined in the Oscar specification. This may include determining an amount of cushioning available between the occupant and the seat pan and sizing and shaping the seat pan as a function of the cushioning so that a desired body pressure distribution (BPD) is achieved relative to a support structured shaped to mimic or mirror the pan shape 20.

The pan shape 20 may be based on correcting a corresponding Oscar shape to accommodate the following skeletal anthropometric limits: the 95th percentile bi-ischial breadth of a female; the 95th percentile bi-trochanter breadth of a seated female; and the 95th percentile bi-cristale breadth of a female. The pan shape maybe further adjusted to accommodate the following soft tissue anthropometric limits: the 95th percentile hip breadth of a seated female; the 95th percentile buttock to popliteal length of a male; the 5th Percentile buttock to popliteal length of a female; and the 50th percentile leg splay of a male.

Once the pan shape 20 is derived from correcting the corresponding Oscar shape according to the above-noted anthropometric limits, it may be further corrected according to other features and parameters associated with occupant support. For example, bolsters (generally upwardly curving portions) may be added to the seat pan to provide lateral support to the occupant.

The pan shape 20 of the present invention, thus, is adapted to comport with larger body profiles while allowing it to meet the performance and safety requirements associated with the Oscar specification. This can be a very useful tool for system designers when designing and assessing seat constructions as it allows them to construct seats to the passengers of today while also assuring compliance with government regulations.

Figure 3:
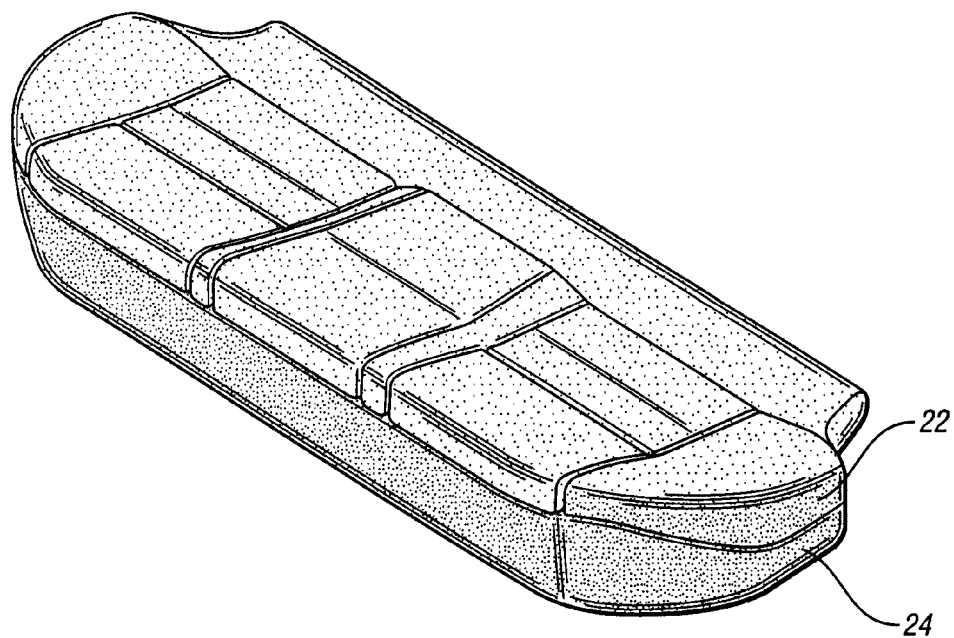
FIG. 3 illustrates a three-dimensional CAD representation of the seat bottom in accordance with one non-limiting aspect of the present invention.

FIG. 3 illustrates a three-dimensional CAD representation of the seat bottom 14 in accordance with one non-limiting aspect of the present invention. The seat bottom 14 includes an upper cushioning portion 22 and a lower supporting portion 24. The upper and lower portions 22-24 may include any number of features, devices, elements, etc. to facilitate supporting the seat occupant, as one having ordinary skill in the art will appreciate.

Figure 4:
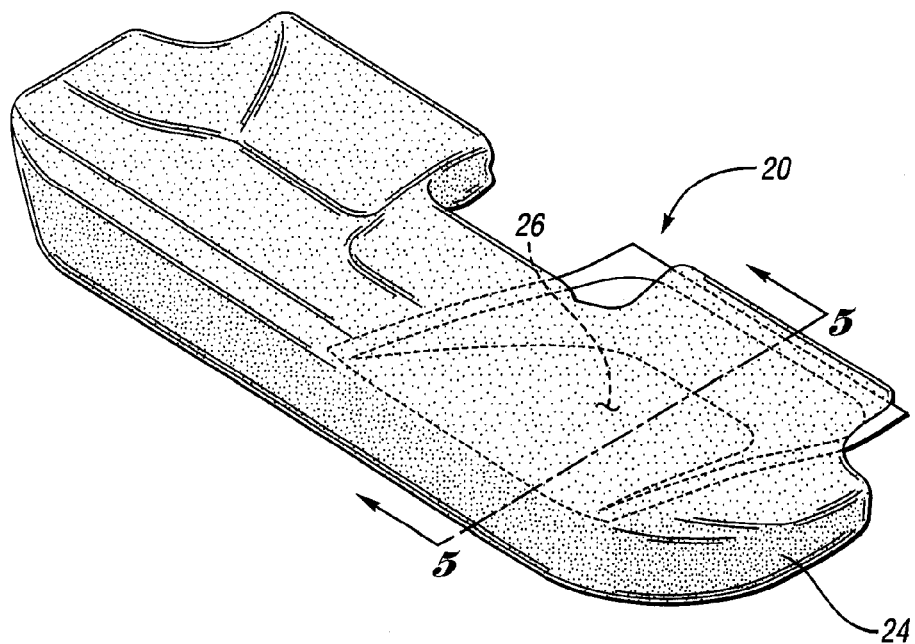
FIG. 4 illustrates a lower portion of a seat bottom with a pan shape overlay in accordance with one non-limiting aspect of the present invention.

FIG. 4 illustrates the lower portion 24 of the seat bottom 14 with a pan shape overlay 20 in accordance with one non-limiting aspect of the present invention. The pan shape overlay 20 may be a CAD object that is overlayed relative to the lower seat portion 24. The overlay 20 allows the designer to review the curvature, shape, length, width, and other dimensioning of the support portion relative to the pan shape 20.

Any portions of the lower portion 24 that extend above or below the pan shape 20 indicates the corresponding support portion is outside the boundaries of the pan shape 20. This produces non-desirable pressure against the occupant, i.e., too much or too little pressure. For example, an upwardly extending portion 26 of the lower seat portion 24 extends above the pan shape 20. This portion 26 corresponds with a curvature in excess of that dictated by the pan shape 20, which can lead to non-desirable pressure.

Based on the three-dimension comparison provided by the pan shape 20, the designer may skive or make other adjustments to the seat portions outside of the boundaries of the pan shape 20. Optionally, the CAD program may be configured to highlight or otherwise call out the portions beyond the pan shape 20 boundaries to facilitate designer directed correction and/or the CAD program may be configured to automatically make adjustments to the shape of the support layers as to achieve the desired pan shape.

Figure 5:
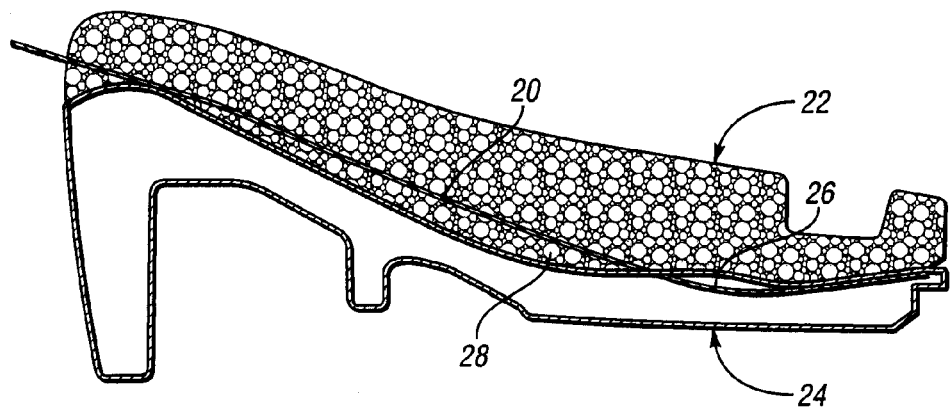
FIG. 5 illustrates a cross-sectioning of the lower portion and pan shape in accordance with one non-limiting aspect of the present invention.

FIG. 5 illustrates a cross-sectioning of the lower and upper portions 22-24 and pan shape 20 in accordance with one non-limiting aspect of the present invention. The cross-sectioning allows for an incremental analysis of the portions 22-24 relative to the seat pan 20. This can be helpful if providing a better view of and distinguishing the whether the elements of the portions 22-24 that are extending the boundaries of the pan shape 20.

The portion 26 of the lower portion 24 is shown as being above the pan shape 20 and a portion 28 of the upper portion 22 is shown as being below the pan shape. These portions 26-28 may need to be correspondingly lowered and raised or otherwise adjusted to correspond with the pan shape 20 in order to avoid an undesirable pressure. The computer and/or designer may perform the necessary adjustments associated with correcting the shapes. Multiple cross-sections may be taken to view and correct different portions of the seat bottom 14.

Figure 6:
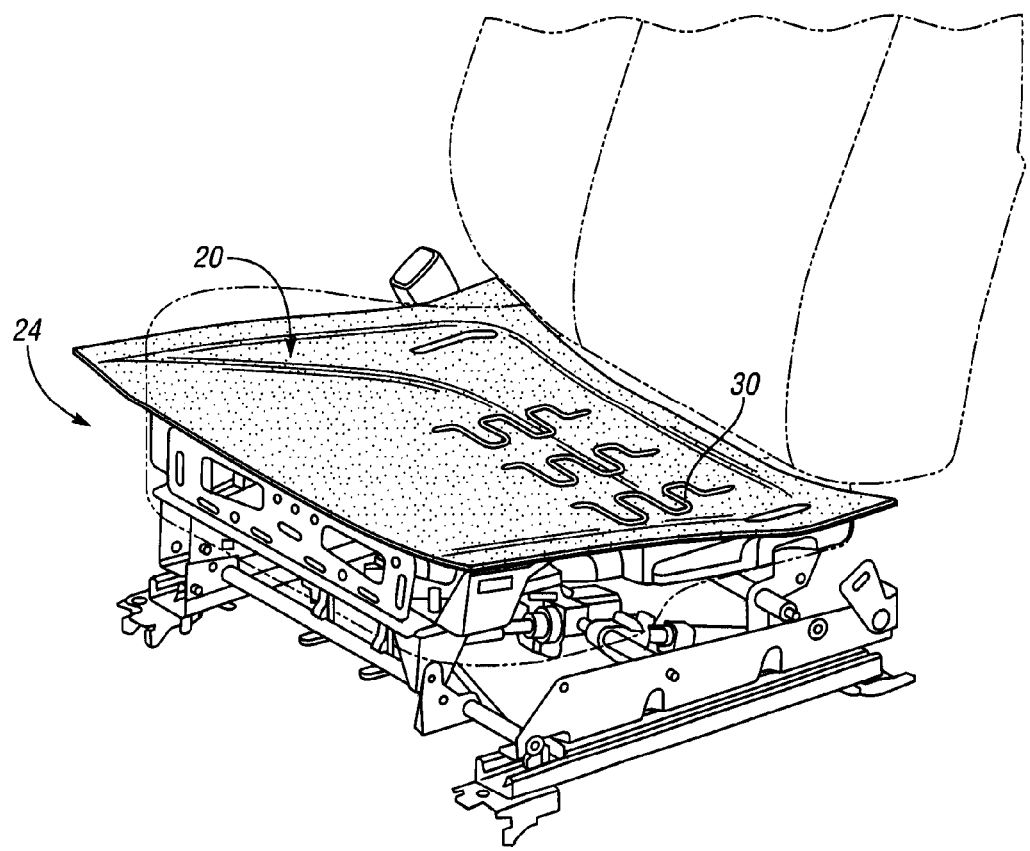
FIG. 6 illustrates a more detailed view of the lower portion having the pan shape overlay in accordance with one non-limiting aspect of the present invention.

FIG. 6 illustrates a more detailed view of the lower portion 24 having the pan shape overlay 20 in accordance with one non-limiting aspect of the present invention. As shown, a number of elements associated with the lower portion 24 are illustrated in more detail. The pan shape overlay 20 is positioned relative to an architectural representation of the seat bottom elements so as to assess whether the shapes and contours thereof mesh with the designed shape and contour of the seat bottom 24.

This allows the present invention to assess the seat bottom design based on whether the seat bottom elements extends above the pan shape. In contrast, the illustrations of FIGS. 4-5 that relate to a seat bottom design wherein the pan shape 20 is associated with a solid foam or cushioning support layer (lower portion 24) used to support a foam or cushion (upper portion 22) such that the support layer is shaved, trimmed, skived, or otherwise adapted to achieve the desired shape.

The pan shape 20 of FIG. 6 indicates a portion of a cushion support frame 30 extends above the pan shape overlay 20 such that the corresponding elements are beyond the boundaries of the pan shape 20 and potential sources of undesirable pressure. The overlay 20 allows the designer and/or CAD application to quickly recognize this and to take corrective action, such as by adjusting the positioning or configuration of the cushion support frames 30.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of computer-assisted assessment of vehicle seat bottom design, the method comprising:

in response to user identification of a vehicle seat bottom, automatically importing a data file representing an internal structure component infrastructure for the vehicle seat bottom from a computer memory for use with a computer assisted drawing (CAD) application operating on a computer to generate a visual output, the internal structure component infrastructure visually representing internal structural components of the seat bottom;

in response to user identification of a body profile, automatically importing a pan shape data object representing the body profile from the computer memory for input to the CAD application, the pan shape data object visually representing a pressure distribution of a seat occupant matching the identified profile as at least a two-dimension object having an upper and a lower side;

overlaying the pan shape data object relative to the internal structure component infrastructure so that the visual output shows both of the pan shape object and the structural components; and automatically identifying portions of the internal structural components within the visual output that penetrate through both of the upper and lower sides of the pan shape object as areas where the seat occupant experiences undesirable pressures.

2. The method of claim 1 further comprising automatically outputting a data file that represents the identified portions of the internal structural components to have undesirable pressures.

3. The method of claim 2 wherein the data file represents an extent by which the identified portions of the internal structural components extend beyond the boundaries of the pan shape data object.

4. The method of claim 2 further comprising identifying the identified portions of the internal structural components without user input of the identified portions of the internal structural components to the CAD application.

5. The method of claim 2 further comprising automatically changing characteristics of the internal structural components with the CAD application through an iterative process where the CAD application automatically adjust dimensioning of the internal structural components until the internal structural components are no longer extending beyond the upper side of the pan shape data object.

6. The method of claim 1 further comprising displaying the identified portions of the internal structural components in a cross-section view.

7. The method of claim 1 wherein the pan shape is associated with a solid seat bottom support portion comprised totally of a foam material and the method further comprises the CAD application automatically adjusting the solid portion of the foam material to correspond with the pan shape.

8. The method of claim 7 further comprising the CAD application automatically skiving portions of the solid seat bottom support portion extending above the upper portion of the pan shape data object.

9. A method of computer-assisted seat design using a computer assisted drawing (CAD) application, the method comprising:

in response to user selection a vehicle seat, the CAD application automatically generating a visual output representing an internal structural component drawing of at least a portion of the vehicle seat;

in response to user selection of a body profile, the CAD application automatically importing a shaped data object representing pressure distribution of the body profile, the shaped object defining structurally limiting boundaries of the body profile as a two-dimensional shape;

in response to user selection of a cross-section of the drawing to show an internal cross-section of internal structural components of the vehicle seat, the CAD application automatically overlaying the two-dimensional shape relative to the internal cross-section within the visual output and automatically generating electronic data representing portions of the internal cross-section where portions of the internal structural components extending beyond a boundary defined by the two-dimensional shape.

10. The method of claim 9 further comprising the CAD application adjusting the component drawing based on user input of adjustments to the component drawing and automatically re-generating electronic data representing any portions of the cross-section where portions of the internal structural components extend beyond the boundary defined by the two-dimensional shape.

11. The method of claim 9 further comprising the CAD application automatically highlighting each portion of the portions of the internal structural components that extend beyond the boundary defined by the two-dimensional shape, the highlighted portions being limited to those portions that extend beyond the boundaries of the shaped data object.

12. The method of claim 11 further comprising automatically highlighting the portions in response to user selection of a highlight command.

13. The method of claim 11 further comprising identifying the highlighted portions without user input of the highlighted portions to the CAD application.

14. The method of claim 11 further comprising defining the shaped data object to correspond with a pan shape suitable for use in designing a seat bottom.

15. The method of claim 14 further comprising defining the shaped data object to characterize body profiles having dimensioning corrected relative to Oscar dimensioning yet sufficient to meet Oscar performance requirements.

* * * * *